United States Patent [19]

Beaumont

[11] Patent Number: 4,639,672
[45] Date of Patent: Jan. 27, 1987

[54] NUCLEAR MAGNETIC RESONANCE APPARATUS

[75] Inventor: Chritien J. M. Beaumont, Eindhoven, Netherlands

[73] Assignee: U.S. Philips Corporation, New York, N.Y.

[21] Appl. No.: 659,214

[22] Filed: Oct. 10, 1984

[30] Foreign Application Priority Data

Oct. 14, 1983 [NL] Netherlands ................. 8303534

[51] Int. Cl.⁴ .............................................. G01V 3/00
[52] U.S. Cl. ................................. 324/318; 324/319; 336/100; 336/198
[58] Field of Search ............... 324/318, 319, 320, 322; 336/100, 198, 208; 335/90

[56] References Cited
U.S. PATENT DOCUMENTS

| | | | |
|---|---|---|---|
| 1,699,292 | 1/1929 | Hess | 336/198 |
| 2,182,820 | 12/1939 | Pisarev | 336/195 |
| 2,221,670 | 11/1940 | Cooper | 336/198 |
| 2,751,564 | 6/1956 | Marsh | 336/198 |
| 2,827,616 | 3/1958 | Manning | 336/196 |
| 4,456,881 | 6/1984 | Compton | 324/319 |
| 4,456,882 | 6/1984 | Doty | 324/318 |
| 4,490,675 | 12/1984 | Knuettel et al. | 324/319 |

Primary Examiner—Stewart J. Levy
Assistant Examiner—John Kwon
Attorney, Agent, or Firm—Robert T. Mayer; Algy Tamoshunas

[57] ABSTRACT

Inside the gradient coils in the magnet system of a nuclear magnetic resonance apparatus there is arranged a sleeve which forms a noise-absorbing shield between the gradient coils and the measurement space. The shield is preferably formed by an evacuated space between the sleeve and a support for the gradient coils. This space is then provided with elastic vacuum seals at its axial ends.

9 Claims, 1 Drawing Figure

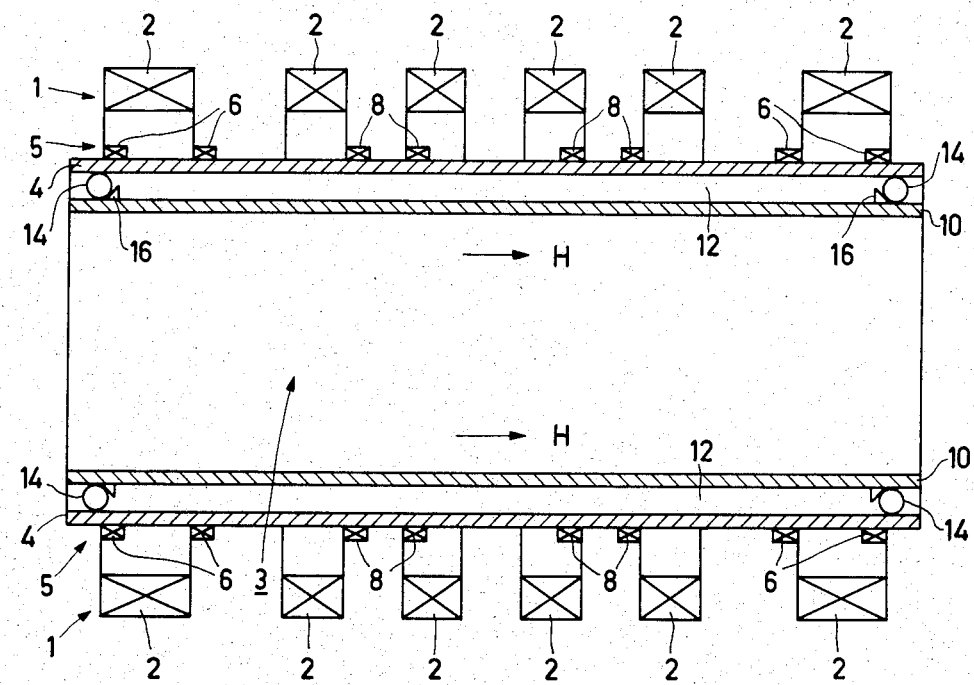

NUCLEAR MAGNETIC RESONANCE APPARATUS

The invention relates to a nuclear magnetic resonance apparatus, comprising a cylindrical electromagnetic main coil system for generating a homogeneous magnetic field in a measurement space and a gradient coil system for generating gradient fields in the measurement space, and also relates to a magnet system for such an apparatus.

A nuclear magnetic resonance apparatus of this kind is known from Computertomographie 1 (1981), pages 2-10. In such an apparatus the noise produced by the gradient coil system when this system is activated for generating gradient fields in the measurement space is very annoying. The noise is caused by comparatively strong Lorentz forces whereto current-carrying windings of the gradient coils are subjected due to the strong homogeneous local magnetic field of the main coil system at this area. The frequencies of the current variations for the gradient coils in a customary measurement process are situated exactly in the range which is annoying to humans. This noise is even more annoying because a patient is more or less enclosed in the apparatus during the examination.

It is the object of the invention to avoid or at least substantially mitigate this annoyance from noise. To this end, a nuclear magnetic resonance apparatus of the kind set forth is characterized in that a concentrically arranged sleeve forms a noise-absorbing shield between the measurement space and the gradient coil system.

As a result of the inclusion of the sleeve, the noise level in a nuclear magnetic resonance apparatus in accordance with the invention can be substantially reduced at least within the measurement space.

The outer diameter of the sleeve in a preferred embodiment is a few centimeters smaller than the inner diameter of the gradient coil system or, practically speaking, a few centimeters smaller than the inner diameter of a cylindrical support for the gradient coils. When the space between the sleeve and the gradient coil support is sealed by means of seals provided at the axial ends of the sleeve, the intermediate space can be evacuated. An extremely effective noise barrier can thus be obtained between the gradient coil support and the measurement space. The seals are made, for example of a noise-absorbing material, of elastic inflatable rings, of metal bellows or the like. The sleeve may alternatively, form one integral unit with the support for the gradient coils; in other words, the gradient coil support may have a double-walled construction, in which case the intermediate space is again evacuated.

In a further preferred embodiment, the sleeve is made completely of a noise-absorbing material and is arranged against the inner side of the gradient coil support.

When the sleeve is made of a material having a comparatively low thermal conductivity and provided with a layer which reflects thermal radiation, the sleeve can also serve as a heat shield between the coil system and the measurement space.

Some preferred embodiments in accordance with the invention will be described in detail hereinafter with reference to the drawing. The sole FIGURE shows a magnet for a nuclear magnetic resonance apparatus in accordance with the invention, comprising a magnet coil system 1 with current windings 2 for generating a comparatively strong homogeneous magnetic field H in a measurement space 3, and a cylinder 4 which acts as a support for a gradient coil system 5 which comprises gradient coils 6 for generating a radial gradient field and gradient coils 8 for generating axially directed gradient fields. During operation of the apparatus, the axially directed magnetic field H of the magnetic coil system 1, which may also be a solenoid or a combination of a solenoid and annular windings, also prevails at the area of the gradient coils. The lines of force of the magnetic field H coincide with surface lines of the cylindrical support 4 at the area of the gradient coils. A radially directed Lorentz force is exerted on each wire turn of the gradient coils which encloses an angle with respect to these surface lines when these wires carry a current, notably on the parts of the turns which extend along radial cross-sectional circles of the cylinder. A current of 100 A is not uncommon for the gradient coils; for a local magnetic field of, for example 0.5 tesla and 10 turns per winding, the Lorentz force amounts to 500N per meter of length of the winding. Because the gradient currents are continuously switched with on and off times of approximately 1 ms, radial Lorentz forces which alternate at this frequency occur on the gradient coil support. Moreover, the gradient coil support also acts as a sound-board for the vibrations produced by these forces.

For suitable operation of the apparâtus the position of the gradient coils must be properly defined. One solution where the gradient coils are more or less elastically suspended has an adverse effect on the imaging quality of the apparatus. In accordance with the invention, a sleeve 10 is arranged in the gradient coil support 4. The outer diameter of the sleeve is, for example approximately 5 to 10 centimeters smaller than the inner diameter of the support 4, so that a space 12 is formed between the support and the cylinder, said space having a radial dimension of approximately from 2 to 5 cm. In the embodiment shown, this space is sealed near the axial ends of the sleeve by means of rings 14. These rings may be made of noise absorbing material, but may also be formed by elastic, inflatable hollow rings, for example bicycle tyres. In order to prevent the rings from penetrating into the space 12 when the latter is evacuated, ridges 16 may be provided. Such ridges may also be provided on the inner side of the gradient coil support and, in order to prevent the transmission of sound, they may have an alternating comb-shaped profile instead of being continuous. The rings may alternatively be connected to the sleeve or all around the gradient coil support or be secured to both. In the latter case the connections preferably consist of metal bellows. When the gradient coil support 4 is constructed to form one integral unit with the sleeve 10, the connection between the two parts should also be noise-absorbing for suitable noise isolation, for example again by means of suitably vacuumtight bellows or elastic rings.

In another embodiment, the entire sleeve is made of a noise-absorbing material. The rings 14 are then absent and the sleeve extends up to the gradient coil support. A sleeve of this kind has the additional advantage that, when suitably constructed, it can act as a heat shield between the coil system and the measurement space. In the case of resistance magnets, the measurement space can thus be maintained at a lower temperature while in the case of superconducting magnets excessive cooling of the measurement space can be prevented. The effectiveness of the heat shield can be increased by providing the sleeve with a layer which reflects thermal radiation and which is provided on the inner circumference or on the outer circumference, depending on the temperature gradient. A sleeve as shown in the FIGURE can also be made of material having a comparatively low thermal conductivity. Such a sleeve can also be used as a support for further parts of the apparatus, such as measuring/transmission coils for R.F. electromagnetic fields, which are to be arranged in or near the measurement space.

What is claimed is:

1. A nuclear magnetic resonance apparatus comprising an electromagnetic main coil system extending about a generally cylindrical interior area and generating a homogeneous magnetic field in a measuring space within said interior area, a gradient coil system for generating gradient fields in said measurement space, and noise absorbing means disposed between said measurement space and said gradient coil system for reducing, within said measurement space, noise produced by said gradient coil system upon activation thereof.

2. The apparatus according to claim 1 wherein said noise absorbing means includes a sleeve which is generally coaxial with said interior region and is arranged between said gradient coil system and said measurement space so as to form a noise absorbing shield therebetween.

3. The apparatus according to claim 2 including a second cylindrical sleeve disposed about and coaxial with said first-named sleeve and means disposed at each end of said sleeves for sealing the space therebetween so as to form a sealed space which can be evacuated, said sealed space extending between said measuring space and said gradient coil system.

4. The apparatus according to claim 3 wherein said second sleeve forms a support for said gradient coil system.

5. The apparatus according to claim 3 or 4, wherein said sealing means includes an inflatable hollow elastic ring disposed between said sleeves at each end thereof.

6. The apparatus according to claim 2 wherein said sleeve is made of plastic having a comparatively low thermal conductivity.

7. The apparatus according to claim 2 wherein said sleeve is made of noise absorbing material.

8. The apparatus according to claim 2 wherein said surface of said sleeve is provided with a thermal radiation shield.

9. The apparatus according to claim 2 wherein said sleeve acts as a support for parts of the apparatus which are to be arranged in or near said measuring space.

* * * * *